United States Patent

Hufford et al.

[11] Patent Number: 6,134,452
[45] Date of Patent: Oct. 17, 2000

[54] MULTIPLE BAND MIXER WITH COMMON LOCAL OSCILLATOR

[75] Inventors: Curt Hufford, Delavan, Wis.; Frank Skutta, Palatine, Ill.

[73] Assignee: Motorola, Inc., Schaumburg, Ill.

[21] Appl. No.: 09/198,286

[22] Filed: Nov. 23, 1998

[51] Int. Cl.[7] .................................................. A01J 21/00
[52] U.S. Cl. ........................ 455/552; 455/180.1; 455/93; 455/189
[58] Field of Search .................................. 455/323, 330, 455/332, 333, 552, 553, 180.1, 188.1, 432; 327/113, 355–356

[56] References Cited

U.S. PATENT DOCUMENTS

| | | | |
|---|---|---|---|
| 3,940,697 | 2/1976 | Morgan | 325/333 |
| 4,320,531 | 3/1982 | Dimon | 455/203 |
| 4,451,930 | 5/1984 | Chapman | 455/260 |
| 4,726,072 | 2/1988 | Yamashita | 455/189 |
| 5,239,271 | 8/1993 | Ben-Efraim | 328/14 |
| 5,307,517 | 4/1994 | Rich | 455/306 |
| 5,465,415 | 11/1995 | Bien | 455/326 |
| 5,771,442 | 6/1998 | Wang | 455/93 |
| 5,832,027 | 11/1998 | Ishigaki | 375/206 |
| 5,915,223 | 6/1999 | Lecuyer | 455/552 |
| 5,995,814 | 11/1999 | Yeh | 455/180.1 |
| 6,075,996 | 6/2000 | Srinivas | 455/552 |

*Primary Examiner*—Nguyen Vo
*Assistant Examiner*—John J. Lee
*Attorney, Agent, or Firm*—Randall S. Vaas; Michael C. Soldner

[57] ABSTRACT

A multiple band mixer (204) includes at least one transistor element (313, 324, 400). A single local oscillator provides a signal to one terminal of the at least one transistor element. The communication signals for each frequency band is input to the at least one transistor element at another terminal. A third terminal of the at least one transistor element is connected to the output.

16 Claims, 3 Drawing Sheets

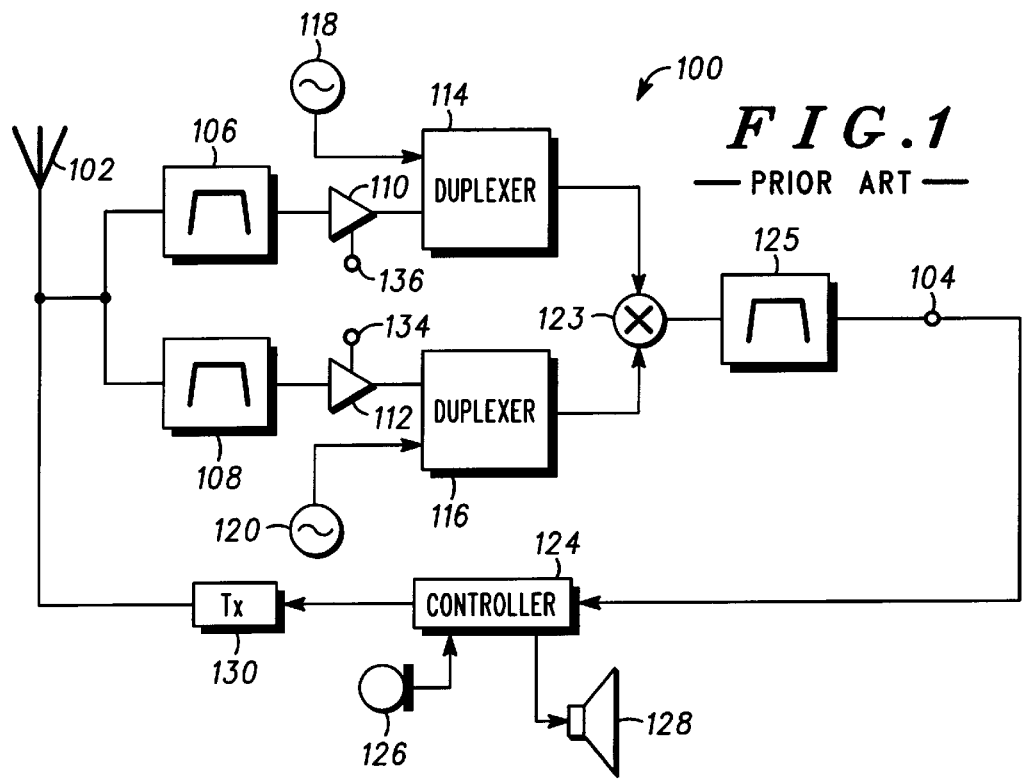
FIG.1 — PRIOR ART —
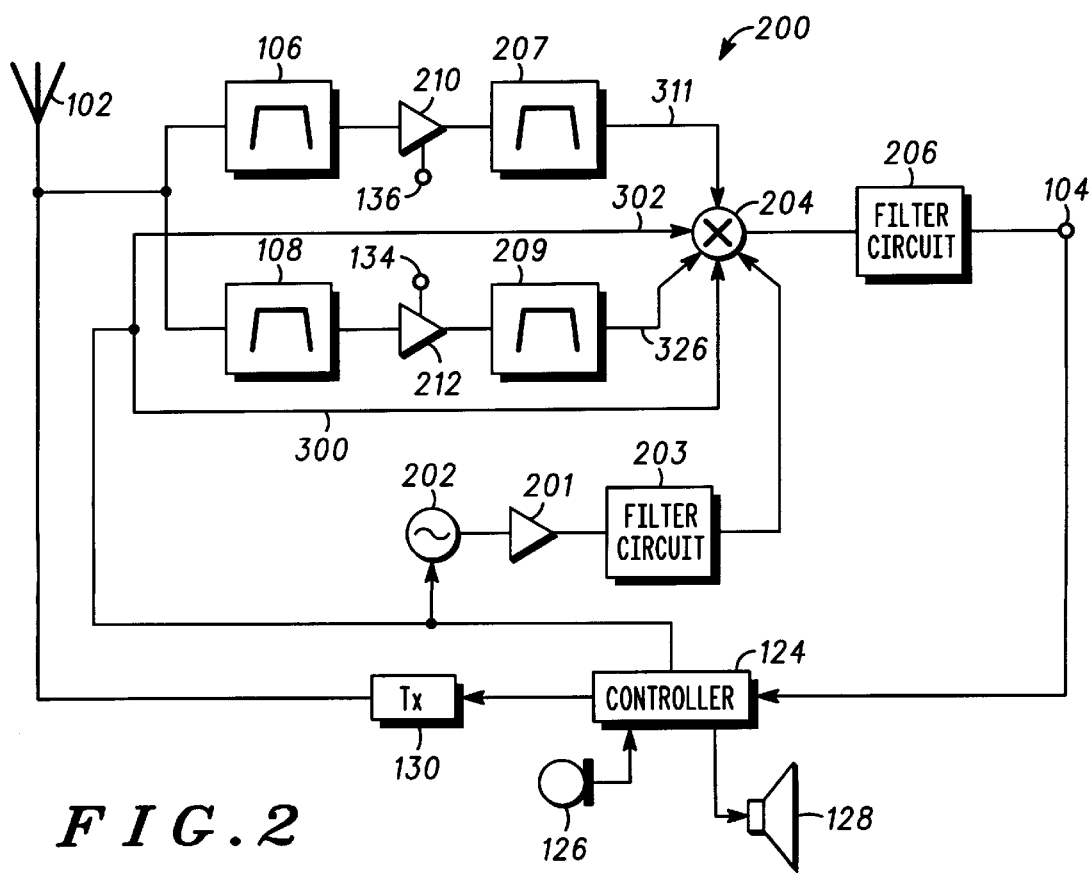
FIG.2

MULTIPLE BAND MIXER WITH COMMON LOCAL OSCILLATOR

BACKGROUND OF THE INVENTION

The present invention pertains to mixers, and more particularly to mixers for multiple band communication devices.

FIELD OF THE INVENTION

Some communication devices are required to process signals in multiple frequency bands. For example, cellular radiotelephones capable of operating in both global system for mobile communications (GSM) networks and digital cellular system (DCS) networks must operate at both the 900 MHz band of the GSM network and the 1800 MHz band of the DCS network. The frequency band used for a particular communication is selected based upon the system that is available during that communication, as well as other selection criteria. Since either frequency band could be required, a receiver in such a communication device must be capable of demodulating signals in both frequency bands.

Known dual band radiotelephone communication devices operate with two local oscillator input signals, one of which is associated with each of the two frequency bands. The demodulated signals for each of the frequency bands are duplexed into a single signal that is further processed in mixers and filters.

As communication devices become smaller, it desirable to consolidate circuitry to reduce the total number of parts, thus permitting a dual mode transceiver to fit in the same volume as a single band transceiver. Accordingly, there is a need for a dual band mixer that uses fewer parts and occupies a smaller volume than known dual-band mixer systems.

BRIEF DESCRIPTION OF THE DRAWINGS

FIG. 1 is a circuit schematic in block diagram form illustrating a portion of a receiver circuit.

FIG. 2 is a circuit schematic in block diagram form illustrating a portion of an improved receiver circuit.

DETAILED DESCRIPTION OF THE DRAWINGS

Figure 3:
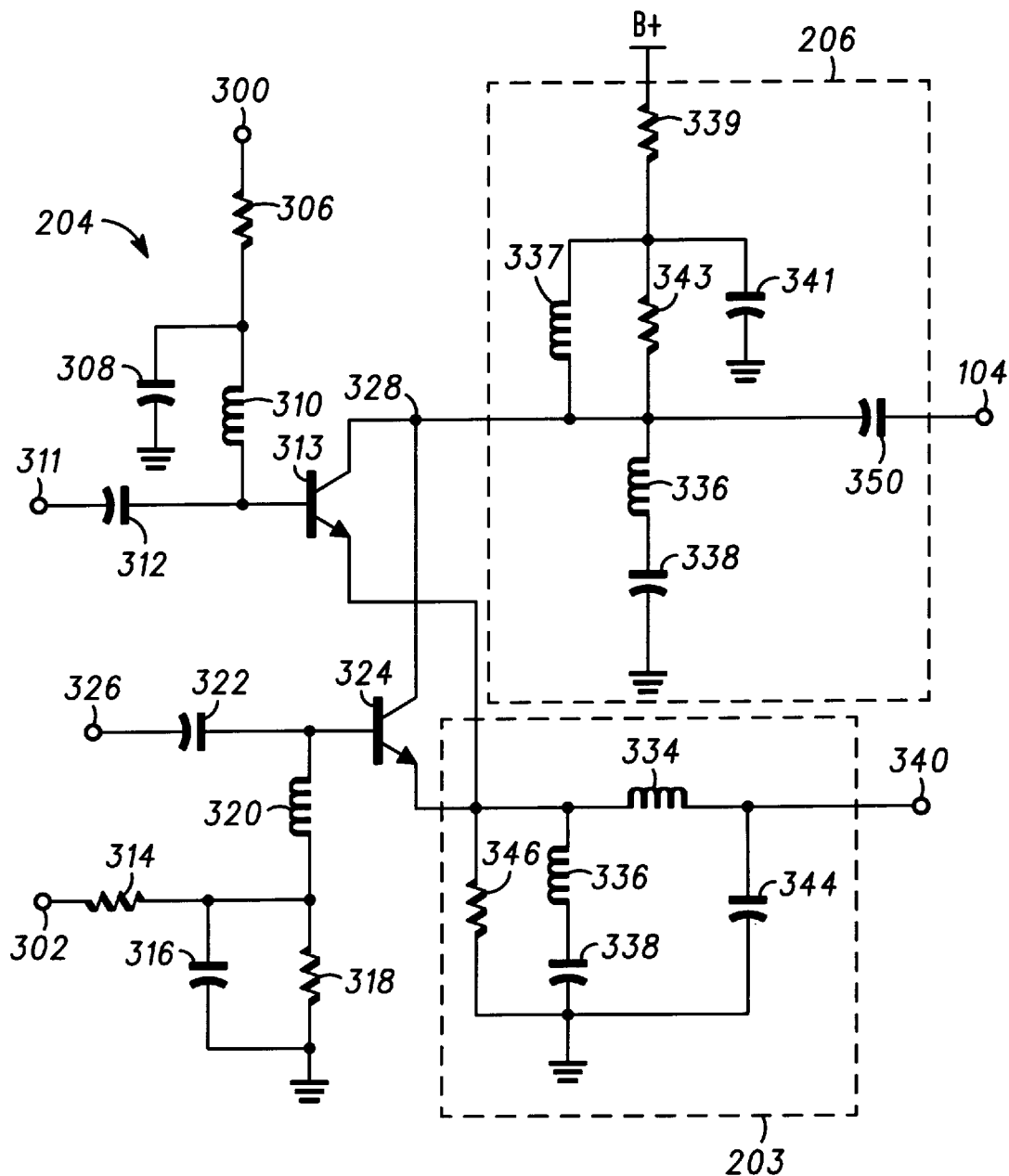
FIG. 3 is a circuit schematic illustrating a mixer in the circuit according to FIG. 2.

The present invention uses a single local oscillator to generate signals for two frequency bands. The mixer includes at least one transistor element. The local oscillator signal is input to one terminal of the at least one transistor element through a filter. The communication signals for each transmission band is input to another terminal of the at least one transistor element. A third terminal of the at least one transistor element is connected to the multiple band oscillator output.

A prior art communication device 100 (FIG. 1) includes an antenna 102. The receiver of communication device 100 includes filters 106 and 108 for separating the signals in each of the frequency bands. In the illustrated dual band radiotelephone for GSM and DCS operation, filter 106 passes signals in the 1800 MHz band and filter 108 passes signals in the 900 MHz frequency band. The outputs of filters 106 and 108 are amplified in amplifiers 110 and 112, respectively.

An input 136 of amplifier 110 receives a DCS mode control signal and an input 134 of amplifier 112 receives a GSM mode control signal. The mode control signals select one of the amplifiers to pass received signals to select the active frequency band.

The amplified signals from amplifiers 110 and 112 are processed in duplexers 114 and 116, respectively. Duplexer 114 receives a local oscillator signal from oscillator 118 and duplexer 116 receives a local oscillator signal from oscillator 120. The signals from duplexers 114 and 116 are mixed in mixer 123 and filtered in filter 125.

The multiple band mixer output 104 is connected to controller 124, which can for example be connected to a microphone 126 and a speaker 128 in a radiotelephone or two-way radio. The controller 124 is also connected to a transmitter 130 which modulates signals for transmission to other devices, such as a base station (not shown).

The improved communication device 200 (FIG. 2) has a single local oscillator 202 connected through an isolation amplifier 201 and a filter circuit 203 to a multiple band mixer 204. The multiple band mixer 204 receives a 900 MHz communication signal from filter 106, amplifier 110, and filter 207, and an 1800 MHz communication signal from a filter 108, an amplifier 112, and a filter 209. The multiple band mixer 204 outputs a demodulated signal to filter circuit 206. Mode control signals from the controller 124 are input to amplifier 210 and amplifier 212 at inputs 230 and 234, respectively, and to mixer 204, to select one of the frequency bands.

The circuit of communication device 200 is considerably less complex than the circuit from communication device 100, as it employs a single oscillator and does not require that the LO signal be input through the duplexers 114, 116. Such duplexers that receive the LO signal and the communication signals are relatively large, taking up considerable space. Although the invention is described with respect to a dual band radiotelephone, those skilled in the art will recognize that the present invention can be advantageously implemented in any multiple band device, such as modems, or any other communication device that operates at two or more frequency bands.

The multiple band mixer 204, including filter circuit 203 and filter circuit 206 of communication device 200, is illustrated in FIG. 3. The filter circuit 206 presents: selectivity to noise; passes LO signals (1.3 to 1.4 GHz in the example); and presents a low impedance to communication signals and the IF signals. These characteristics of the filter circuit 206 permit the mixer to achieve the noise attenuation and gain required for the mixer.

The multiple mode mixer 204 includes mode control inputs 300 and 302, respectively. The mode control inputs are used to select the mode (frequency band) to be further processed. In the illustrated embodiment, the GSM band mode control signal is input to mode control input 300 via a resistor 306, a capacitor 308, and an inductor 310. The GSM band communication signal is input at input 311 and passes through a capacitor 312. The resulting enabled GSM signal is input to the base terminal of a transistor element 313.

The DCS band mode control signal is input at mode control input 302. This signal is input through a resistor 314, a capacitor 316, a resistor 318, and an inductor 320. The DCS band communication signal is input from input 326 through a capacitor 322. The resulting 1800 MHz signal is input to the base terminal of a transistor element 324. The transistor element may be implemented using a bipolar transistor, a field effect transistor, a metal oxide semiconductor field effect transistor (MOSFET), or another suitable commercially available transistor switch element, such as a Darlington transistor. As used herein "transistor element" refers to any such element or equivalents thereof. Additionally, although the illustrated embodiment employs bipolar transistors having a base, emitter and collector terminals, "terminal" as used herein refers to base, collector, emitter, drain, source and gate terminals, or the like.

The collector terminals of transistor elements 313 and 324 are connected at terminal 328, which is connected to a filter circuit 206. The filter circuit 206 includes inductor 336 and capacitor 338 connected in series to ground, an inductor 337, a resistor 339, a capacitor 341, and a resistor 343. A capacitor 350 is connected to the multiple band mixer output 104.

The emitter terminals of transistor elements 313 and 324 are connected to the local oscillator input 340 via filter circuit 203. The filter circuit 203 includes a capacitor 344, a resistor 346, an inductor 334, an inductor 336, and a capacitor 338.

The operation of multiple band mixer 204, including filter circuits 203 and 206, will now be described. The local oscillator 202 is connected to the emitter terminals of transistor elements 313 and 324. The local oscillator is the oscillator in the communication device 200, which may for example be cellular radiotelephone. The inductors 334 and 336, and capacitor 338, present low impedances to the communication signal frequencies and output signal frequencies. In particular, for the exemplary frequencies described herein, capacitor 338 presents a low impedance at 900 MHz, inductor 334 and capacitor 344 present a low impedance at 1800 MHz, and capacitor 338 presents a low impedance at 400 MHz. The impedance elements thus provides a signal path to ground for each of the signals in these frequencies.

The collector terminals of transistor elements 313, 324 are connected to the output multiple band mixer output 104 via filter circuit 206, which passes only the intermediate (IF) signals. For the output filter circuit 206, the inductor 336 and capacitor 338 are a series resonant circuit at the injection frequency (e.g., 1.3 and 1.4 GHz) and a relatively low impedance at the communication signal frequencies (e.g., 900 MHz and 1.8 GHz). Inductor 337 is anti-resonant at the output frequency (e.g., 400 MHz intermediate frequency (IF) of the output) at the multiple band mixer output 204. The GSM mixer is matched to 50 ohms with capacitor 312 and inductor 310. Capacitor 308 and inductor 310 are close to series resonant at the output frequency (e.g., 400 MHz). The DCS mixer is matched to 50 ohms by capacitor 322 and inductor 320. Capacitor 316 and resistor 318 are close to series resonant at the output frequency (e.g., 400 MHz).

The mode control signal at mode control input 300 is a binary signal which is ON when the device is in GSM mode (high voltage) and OFF when the device is not in a GSM mode (ground). The resistor 306 pulls the base terminal of transistor element 313 up when it is ON. The control input 302 similarly controls transistor element 324. The control signal at input 302 is ON when the signal to be demodulated is in the 1800 MHz signal range and otherwise OFF.

The transistor elements 313 and 324 mix the local oscillator signal at local oscillator input 340, which is 1.3 GHz for communication signals in the 900 MHz band and 1.4 GHz for communication signals in the 1.8 GHz band. The local oscillator signals are input to the emitter terminals of transistor elements 313 and 324. The transistor elements 313 and 324 provide approximately 20 dB of isolation across the base emitter terminals thereof. This isolation eliminates the need for duplexers 114 and 116 found in the prior art. This isolation also attenuate spurious signals that would otherwise interfere with the transmission of signals. Those skilled in the art will recognize that an oscillator can be readily implemented that can be controlled to generate 1.3 and 1.4 GHz signals.

The filter circuit 206 is a bandpass filter to remove signals outside the 400 MHz IF band. A signal, which is the difference between 1300 and 900 MHz, will thus be output for the 900 MHz frequency band. A signal which is the difference between 1.4 and 1.8 GHz will thus be output at the multiple band mixer output 104 for the 1.8 GHz band. The 400 MHz signals pass through the filter circuit 206 to the multiple band mixer output 104.

Figure 4:
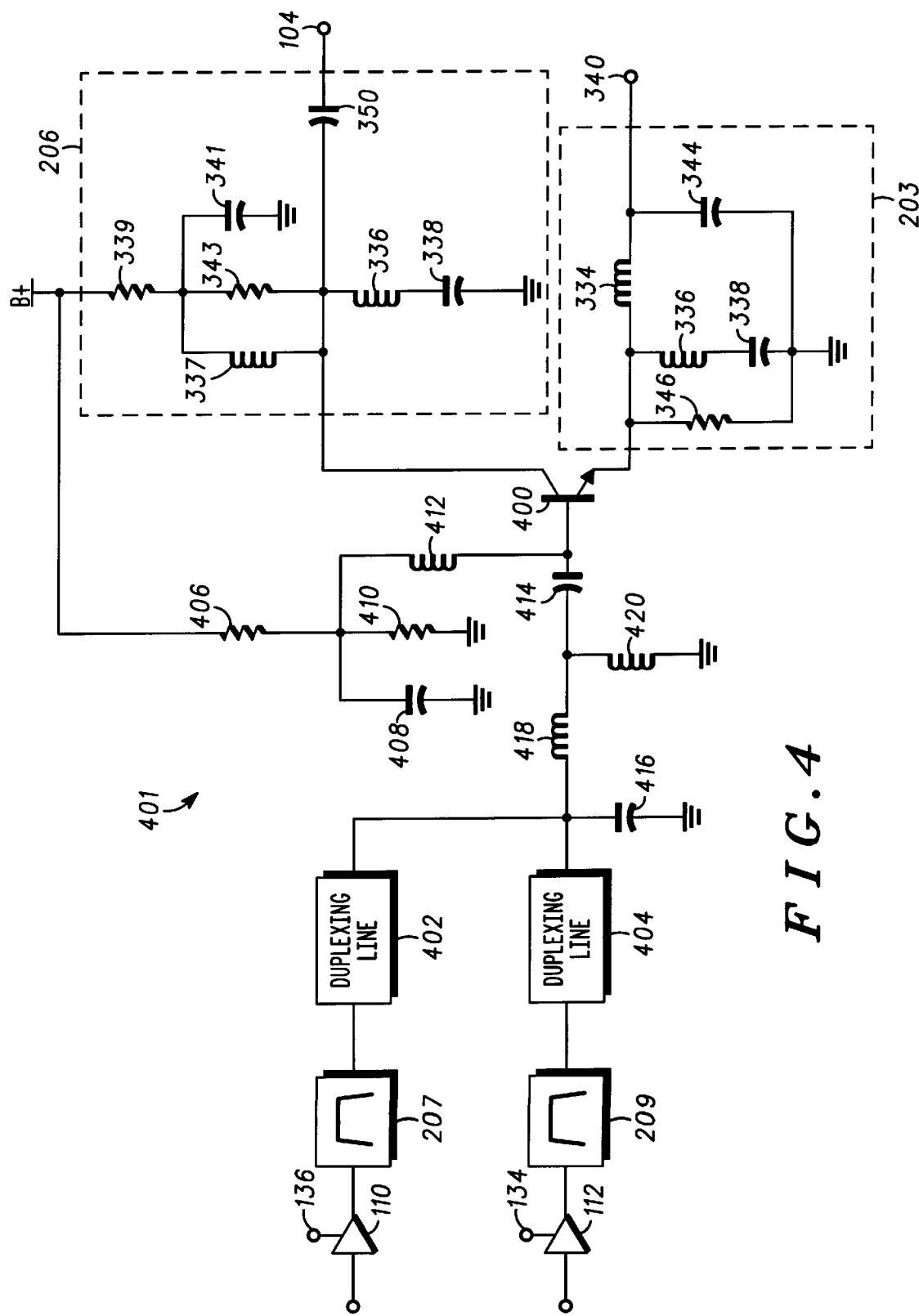
FIG. 4 is a circuit schematic illustrating a mixer according to an alternate embodiment.

An alternate embodiment is illustrated in FIG. 4. The mixer 401 includes a single transistor element 400. A base terminal of the transistor element 400 is connected to the output of filter 109 through a duplexing line 402 and to the output of filter 111 through a duplexing line 404. The duplexing line 402 is tuned to present a high impedance to communication signals in the passband of filter 209. The duplexing line 404 is tuned to present a high impedance to communication signals in the passband of filter 207. Capacitor 416, capacitor 414, inductor 418, and inductor 420 are a band pass filter for signals at the frequency of the communication signals in both communication bands. The resistor 406, resistor 410, capacitor 408 and inductor 412 hold the transistor element 400 ON, remove noise and insure a 50 impedance match. Transistor element 400 modulates the communication signals at the base terminal of transistor element 400 with the local oscillator signal applied to the emitter terminal thereof through filter 203. The resulting demodulated signal is output at the collector terminal of transistor element 400.

Thus it can be seen that a mixer is disclosed that operates with a single local oscillator having a frequency between the receive bandwidths of a multiple band device. The local oscillator signal is injected into one terminal of the at least one transistor element. The communication signals are input to the base terminal. The emitter terminal is connected to a filter circuit such that it passes the LO injection frequency, provides selectivity to noise at the receive frequency, and provides a low impedance at the GSM, DCS and IF frequencies. The mixer circuit uses significantly fewer parts, and does not require duplexing of the receive filter and the local oscillator injection filter as required by the prior art.

Although a two band device is illustrated, it will be recognized by those skilled in the art that the number of frequency bands can be increased by providing additional communication signal inputs and mode control inputs. Additionally, for the embodiment according to FIG. 3, the number of transistor elements can be increased such that one is provided for each channel.

What is claimed is:

1. A multiple band mixer for a local oscillator, comprising:

a first input for communication signals in a first frequency band;

a first transistor element coupled to the first input, a first terminal of the first transistor element coupled to receive the communication signals in the first frequency band;

a second input for communication signals in a second frequency band;

a second transistor element coupled to the second input, a first terminal of the second transistor element coupled to receive the communication signals in the second frequency band;

a first filer circuit;

a local oscillator, the local oscillator coupled to a second terminal of the first transistor element and a second terminal of the second transistor element through the first filter circuit; and a multiple band mixer output, a third terminal of the first transistor element and a third terminal of the second transistor element coupled to the multiple band mixer output, wherein the first and second transistor elements are coupled to output intermediate frequency signals responsive to communication signals in the first frequency band and the second frequency band.

2. The multiple band mixer as defined in claim 1, wherein the first and second transistor elements each include a bipolar transistor.

3. The multiple band mixer as defined in claim 2, wherein the first terminal of the first transistor element is a base of a first bipolar transistor and the first terminal of the second transistor element is the base of a second bipolar transistor.

4. The multiple band mixer as define in claim 1, wherein the first filter circuit is a bandpass filter passing signals output by the local oscillator and providing a low impedance to communication signals in the first and second frequency bands and to the intermediate frequency signals.

5. The multiple band mixer as defined in claim 4, further including a second filter circuit, the second filter circuit coupled between the third terminals of the first and second transistor elements and the multiple band mixer output.

6. The multiple band mixer as defined in claim 1, further including a filter circuit, the filter circuit coupled between the third terminals of the first and second transistor elements and the multiple band mixer output.

7. The multiple band mixer as defined in claim 1, further including a first mode control input for receiving a first mode control signal and a second mode control input for receipt of a second mode control signal, the first mode control signal selecting the first frequency band and the second mode control signal selecting the second frequency band.

8. The multiple band mixer as defined in claim 7, wherein the local oscillator is coupled to receive a mode control signal responsive to which the local oscillator alters its output frequency according to a selected frequency band.

9. The multiple band mixer as defined in claim 1, further including a first mode control input for receiving a first mode control signal, the first mode control input coupled to the first terminal of the first transistor element, and a second mode control input for receipt of a second mode control signal, the second mode control input coupled to the first terminal of the second transistor element, the first mode control signal selecting the first frequency band and the second mode control signal selecting the second frequency band.

10. A multiple band communication device, comprising:

a local oscillator;

a mixer connected to the local oscillator, the mixer including a first mode control input, a second mode control input, a first band communication signal input, a second band communication signal input, a first transistor element and a second transistor element, a first terminal of the first transistor element connected to receive first band communication signals from the first band communication signal input and first mode control signals from the first mode control input, a second terminal of the first transistor element connected to an output of the local oscillator, and a third terminal of the first transistor element connected to a mixer output, a first terminal of the second transistor element connected to receive second band communication signals from the second band communication signal input and second mode control signals from the first mode control input, a second terminal of the first transistor element connected to an output of the local oscillator, and a third terminal of the first transistor element connected to the mixer output; and a controller connected to the local oscillator and the mixer, the controller generating the first and second mode control signals and receiving the demodulated output of the mixer.

11. A multiple band mixer for a local oscillator, comprising:

a first input for communication signals in a first frequency band;

a second input for communication signals in a second frequency band;

duplexing circuit coupled to the first and second inputs;

a transistor element, a first terminal of the transistor element coupled to receive communication signals output from the duplexing circuit;

a first filter circuit;

a local oscillator, the local oscillator coupled to a second terminal of the transistor element through the first filter circuit; and a multiple band mixer output, a third terminal of the transistor element coupled to the multiple band mixer output, wherein the transistor element is coupled to output an intermediate frequency signal responsive to communication signals in the first frequency band and the second frequency band.

12. The multiple band mixer as defined in claim 11, wherein the transistor element includes a bipolar transistor.

13. The multiple band mixer as defined in claim 12, wherein the first terminal of the transistor element is a base of the bipolar transistor.

14. The multiple band mixer as define in claim 11, wherein the first filter circuit is a bandpass filter passing signals output by the local oscillator and providing a low impedance to communication signals in the first and second frequency bands and to the intermediate frequency signals.

15. The multiple band mixer as defined in claim 13, further including a second filter circuit, the second filter circuit coupled between the third terminal of the transistor element and the multiple band mixer output.

16. The multiple band mixer as defined in claim 11, further including a filter circuit coupled between the third terminal of the transistor element and the multiple band mixer output.

* * * * *